United States Patent [19]
Itoh et al.

[11] Patent Number: 5,599,775
[45] Date of Patent: Feb. 4, 1997

[54] (HG CU)BG$_2$CA$_2$CU$_3$OY OXIDE SUPERCONDUCTOR AND METHOD OF PREPARING THE SAME

[75] Inventors: Makoto Itoh; Ayako Yamamoto; Kazuyuki Isawa; Seiji Adachi; Hisao Yamauchi; Shoji Tanaka, all of Tokyo, Japan

[73] Assignees: Sumitomo Electric Industries, Ltd.; Tohoku Electric Power Co., Inc.; Matsushita Electric Industrial Co., Ltd.; International Superconductivity Technology Center, all of, Japan

[21] Appl. No.: 591,990

[22] Filed: Jan. 26, 1996

Related U.S. Application Data

[62] Division of Ser. No. 264,660, Jun. 23, 1994, Pat. No. 5,534,490.

[30] Foreign Application Priority Data

Jun. 25, 1993 [JP] Japan ................................ 5-155444

[51] Int. Cl.$^6$ ........................... C04B 35/45; H01B 12/00
[52] U.S. Cl. ........................... 505/125; 505/779; 252/521
[58] Field of Search .................. 505/125, 779; 252/518, 521

[56] References Cited

U.S. PATENT DOCUMENTS 5,534,490  7/1996  Itoh et al. ................................ 505/490

OTHER PUBLICATIONS

Radaelli et al., "Synthesis and Properties of a Cuprate Superconductor Containing Double Mercury–Oxygen Layers", Science, vol. 265, Jul. 15, 1994, pp. 380–383.

Gupta et al., "Mercury–Based Cuprate High–Transition Temperature Grain–Boundary Junctions and SQUIDs Operating Above 110 Kelvin", Science, vol. 265, Aug. 19, 1994, pp. 1075–1077.

Hirabayashi et al., "High–pressure synthesis of single–phase '1223' mercury–based superconductors", PHYSICA C, 219(1–2), 1994.

S. N. Putilin et al. Mat. Res. Bull. vol. 26, pp. 1299–1307, 1991.

S. N. Pulilin et al., Nature vol. 362, 18 Mar. 1993, pp. 226–228.

A. Schilling et al, Nature vol. 363, 6 May 1993, pp. 56–58.

Makoto Itoh et al., Physica C, 13 May 1993, pp. 271–273.

Seiji Adachi et al., Physica C, 23 Jun. 1993, pp. 313–315.

*Primary Examiner*—Douglas J. McGinty
*Assistant Examiner*—M. Kopec
*Attorney, Agent, or Firm*—Pennie & Edmonds

[57] ABSTRACT

Provided is an Hg—Ba—Ca—Cu—O oxide superconductor having a high superconductivity transition temperature Tc and a method which can prepare the same in excellent reproducibility. This oxide superconductor consists essentially of Hg, Ba, Ca, Cu and O, and is expressed in a chemical formula $(Hg_{1-x}Cu_x)Ba_2Ca_2Cu_3O_y$, wherein X=0.05 to 0.7 and Y=8 to 8.75. A method of preparing the oxide superconductor comprises a step of mixing raw materials of Hg, Ba, Ca and Cu with each other so that (Hg+Ba):Ca:Cu =b:1:C and Hg:Ba=(1−a):a, wherein $0.625 \leq a \leq 0.714$, $1 \leq b \leq 3$ and $1.667 \leq c \leq 3.444$, in mole ratio, and compression-molding the mixture, and a step of heat treating a compact obtained by the compression molding. This oxide superconductor has a superconductivity transition temperature Tc of 134 K, which is the highest at present.

2 Claims, 6 Drawing Sheets

(HG CU)BG$_2$CA$_2$CU$_3$OY OXIDE SUPERCONDUCTOR AND METHOD OF PREPARING THE SAME

This is a division, of application Ser. No. 08/264,660, filed Jun. 23, 1994, now U.S. Pat. No. 5,534,490.

BACKGROUND OF THE INVENTION

1. Field of the Invention

The present invention relates to an oxide superconductor and a method of preparing the same, and more particularly, it relates to an oxide superconductor having a high superconductivity transition temperature (Tc =134 K.) exceeding the liquid nitrogen temperature and a method of preparing the same.

2. Description of the Background Art

A superconductor has unique properties of its own such as zero electrical resistance, complete diamagnetism and a Josephson effect. Due to such properties, wide applications of superconductors are expected in relation to power transportation, a generator, nuclear fusion plasma confinement, a magnetic levitation train, a magnetic shield, a high-speed computer and the like.

In 1986, Bednorz and Müller discovered an oxide superconductor $(La_{1-x}Ba_x)_2CuO_4$ having a high superconductivity transition temperature Tc of about 30 K. Following this discovery, there have been reported oxide superconductors having high superconductivity transition temperatures Tc such as $YBa_2Cu_3O_7$ (Tc=90 K.), Bi—Sr—Ca—Cu—O (Tc= 110 K.) and Tl—Ba—Ca—Cu—O (Tc=125 K.). Many researches are now being made in relation to methods of preparing such superconductors, physical properties and applications thereof and the like.

In the process of such researches, a superconductor having a superconductivity transition temperature Tc of 133.5 K. has recently been confirmed in relation to Hg—Ba—Ca—Cu—O ceramics (A. Schilling et al., Nature 363 (1993) 56).

As to the superconductor exhibiting a superconductivity transition temperature Tc of 133.5 K., it is inferred from observation of its lattice image with a transmission electron microscopy that a substance expressed in a chemical formula $HgBa_2Ca_2Cu_3O_Y$ (Y: arbitrary number) having such a crystal structure that eight atomic layers of $HgO_z$—BaO—$CuO_2$—Ca—$CuO_2$—Ca—$CuO_2$—BaO are stacked exhibits the high superconductivity transition temperature Tc. However, no crystal structure of a superconducting crystal phase has been clarified with respect to this superconductor.

A. Schilling et al. further reported that they prepared the superconductor by preparing $Ba_2CaCu_2O_Y$ as a precursor, mixing the same with HgO, vacuum-sealing the mixture in a silica tube, introducing the silica tube into a steel container and firing the same at 800° C. for 5 hours. However, they clarified no mixing ratio of the precursor to HgO. Further, they reported that the silica tube which was introduced into the steel container was cracked after firing, and it was difficult to reproduce their experiment.

Although the superconductor having a superconductivity transition temperature Tc of 133.5 K. was confirmed in the aforementioned manner, it has generally been extremely difficult to reproduce equivalent superconductivity since there has been established no method of preparing the same.

SUMMARY OF THE INVENTION

An object of the present invention is to provide an Hg—Ba—Ca—Cu—O oxide superconductor which exhibits a superconductivity transition temperature Tc of 134 K.

Another object of the present invention is to provide a method which can prepare an Hg—Ba—Ca—Cu—O oxide superconductor exhibiting a superconductivity transition temperature Tc of 134 K. in excellent reproducibility.

According to an aspect of the present invention, provided is an oxide superconductor which consists essentially of Hg, Ba, Ca, Cu and O, and is expressed in a chemical formula $(Hg_{1-x}Cu_x)Ba_2Ca_2Cu_3O_y$, wherein X=0.05 to 0.7 and Y=8 to 8.75.

According to the present invention, the oxide superconductor has such a crystal structure that eight atomic layers of (Hg, Cu)O$_z$—BaO—$CuO_2$—Ca—$CuO_2$—Ca—$CuO_2$—BaO, wherein Z=0 to 0.75, are stacked.

According to another aspect of the present invention, a method of preparing an oxide superconductor which consists essentially of Hg, Ba, Ca, Cu and O, and is expressed in a chemical formula $(Hg_{1-x}Cu_x)Ba_2Ca_2Cu_3O_y$, wherein X=0.05 to 0.7 and Y=8 to 8.75 is provided.

According to this method, raw materials of Hg, Ba, Ca and Cu are first mixed with each other so that (Hg+ Ba):Ca:Cu=b:1:C and Hg:Ba=(1−a):a, wherein $0.625 \leq a \leq 0.714$, $1 \leq b \leq 3$ and $1.667 \leq c \leq 3.444$, in mole ratio, and the mixture is compression-molded. Then, a compact obtained by such compression molding is heat treated.

Preferably, the compact is heat treated in a closed container.

Preferably, the compact is heat treated at a temperature of 640° to 780° C.

Preferably, the compact is further annealed after the heat treatment.

According to the present invention, it is possible to obtain an oxide superconductor exhibiting a superconductivity transition temperature Tc of 134 K., which is the highest at present (as of June 1993).

According to the present invention, it is possible to prepare the oxide superconductor exhibiting the highest superconductivity transition temperature Tc of 134 K. in excellent reproducibility.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
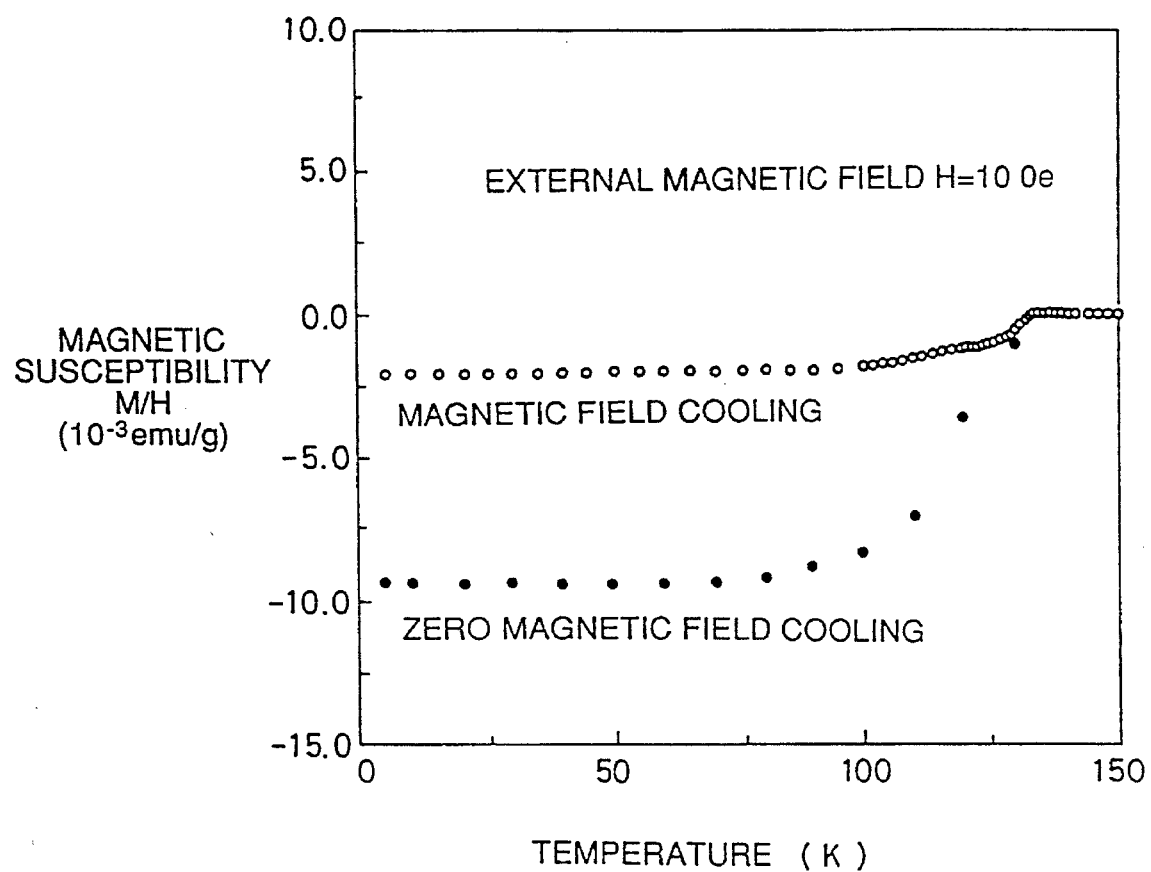
FIG. 1 illustrates magnetic susceptibility-temperature dependence of an annealed sample No. 11.

Respective powder materials of HgO, BaO, CaO and CuO of at least 99% in purity were weighed and mixed with each other at various mixing ratios shown in Tables 1 and 2, and shaped into pellets under a pressure of 800 kg/cm². The compacts as obtained were introduced into gold tubes, both ends of which were then closed by crushing. The gold tubes were further vacuum-sealed into silica tubes, which in turn were fired under various conditions shown in Tables 1 and 2.

Superconducting properties of oxide superconductors obtained in the aforementioned manner were evaluated by measuring temperature dependence values of dc magnetic susceptibility and electrical resistivity. Further, crystal phases of the sintered bodies as obtained were examined by powder X-ray diffraction with CuKα rays. Sampled attained superconductivity after sintering were annealed in flowing oxygen gas at 300° C. for 6 hours.

Tables 1 and 2 show starting compositions, firing conditions and results of measurement of magnetic susceptibility values of the samples. Referring to Tables 1 and 2, "compositions" shows mole ratios of Hg:Ba:Ca:Cu in starting compositions. Further, samples provided with marks ○ and Δ in "diamagnetism" exhibited superconductivity transition temperatures of Tc≧134 K. and Tc<134 K. respectively, while samples provided with marks X were non-superconductive at temperatures exceeding 5 K. As to the samples provided with the marks ○ and Δ, Tables 1 and 2 also show magnetic susceptibility values at 5 K.

[TABLE 1]

| Sample No. | Composition | Temperature | Time | Diamagnetism (After Annealing) | | |
|---|---|---|---|---|---|---|
| 1) | 1.0:2:0.6:2.0 | 700° C. | 1 hr. | x | | |
| 2) | 1.0:2:0.8:2.0 | 700° C. | 1 hr. | x | | |
| 3) | 1.0:2:1.0:2.0 | 700° C. | 20 min. | o | Tc = 134K | $-7.6 \times 10^{-4}$ emu/g |
| 4) | 1.0:2:1.0:2.0 | 700° C. | 1 hr. | o | Tc = 134K | $-1.6 \times 10^{-3}$ emu/g |
| 5) | 1.0:2:1.0:2.0 | 700° C. | 3 hrs. | o | Tc = 134K | $-1.3 \times 10^{-3}$ emu/g |
| 6) | 1.0:2:1.0:2.0 | 500° C. | 1 hr. | x | | |
| 7) | 1.0:2:1.0:2.0 | 600° C. | 1 hr. | x | | |
| 8) | 1.0:2:1.0:2.0 | 750° C. | 1 hr. | o | Tc = 134K | $-8.6 \times 10^{-4}$ emu/g |
| 9) | 1.0:2:1.0:2.5 | 700° C. | 1 hr. | o | Tc = 134K | $-9.2 \times 10^{-4}$ emu/g |
| 10) | 1.0:2:0.8:3.0 | 700° C. | 1 hr. | x | | |
| 11) | 1.0:2:1.0:3.0 | 700° C. | 1 hr. | o | Tc = 134K | $-1.7 \times 10^{-3}$ emu/g |
| 12) | 1.0:2:1.2:3.0 | 700° C. | 1 hr. | o | Tc = 134K | $-1.2 \times 10^{-3}$ emu/g |
| 13) | 1.0:2:1.4:3.0 | 700° C. | 1 hr. | o | Tc = 134K | $-1.0 \times 10^{-3}$ emu/g |
| 14) | 1.0:2:2.0:3.0 | 700° C. | 1 hr. | x | | |
| 15) | 1.0:2:2.0:3.0 | 750° C. | 1 hr. | x | | |
| 16) | 1.0:2:3.0:4.0 | 700° C. | 1 hr. | x | | |
| 17) | 0.6:2:1.0:3.0 | 600° C. | 1 hr. | x | | |
| 18) | 0.6:2:1.0:3.0 | 700° C. | 1 hr. | x | | |
| 19) | 0.8:2:1.0:3.0 | 600° C. | 1 hr. | x | | |
| 20) | 0.8:2:1.0:3.0 | 700° C. | 1 hr. | Δ | Tc = 130K | $-7.6 \times 10^{-4}$ emu/g |
| 21) | 1.0:2:1.0:3.0 | 600° C. | 1 hr. | o | Tc = 134K | $-1.3 \times 10^{-3}$ emu/g |
| 22) | 1.0:2:1.0:3.0 | 700° C. | 1 hr. | o | Tc = 134K | $-1.7 \times 10^{-3}$ emu/g |
| 23) | 1.2:2:1.0:3.0 | 600° C. | 1 hr. | o | Tc = 134K | $-8.3 \times 10^{-4}$ emu/g |
| 24) | 1.2:2:1.0:3.0 | 700° C. | 1 hr. | o | Tc = 134K | $-9.6 \times 10^{-4}$ emu/g |
| 25) | 1.4:2:1.0:3.0 | 600° C. | 1 hr. | x | | |
| 26) | 1.4:2:1.0:3.0 | 700° C. | 1 hr. | Δ | Tc = 131K | $-5.1 \times 10^{-4}$ emu/g |
| 27) | 1.6:2:1.0:3.0 | 600° C. | 1 hr. | x | | |
| 28) | 1.6:2:1.0:3.0 | 700° C. | 1 hr. | x | | |

Composition - Mole ratios of Hg:Ba:Ca:Cu (starting composition)
Diamagnetism -
o: superconducted at Tc ≧ 134K, magnetic susceptibility values were measured at 5K
Δ: superconducted at Tc < 134K, magnetic susceptibility values were measured at 5K
x: non-superconductive at temperatures exceeding 5K

[TABLE 2]

| Sample No. | Composition | Temperature | Time | Diamagnetism (After Annealing) | | |
|---|---|---|---|---|---|---|
| 29) | 0.6:2:3.0:8.0 | 700° C. | 1 hr. | x | | |
| 30) | 0.2:2:3.0:8.0 | 700° C. | 1 hr. | o | Tc = 134K | $-5.7 \times 10^{-4}$ emu/g |
| 31) | 1.0:2:3.0:8.0 | 700° C. | 1 hr. | o | Tc = 134K | $-1.5 \times 10^{-3}$ emu/g |
| 32) | 1.2:2:3.0:8.0 | 700° C. | 1 hr. | o | Tc = 134K | $-1.2 \times 10^{-3}$ emu/g |
| 33) | 1.4:2:3.0:8.0 | 700° C. | 1 hr. | Δ | Tc = 130K | $-5.6 \times 10^{-4}$ emu/g |
| 34) | 1.6:2:3.0:8.0 | 700° C. | 1 hr. | x | | |
| 35) | 0.6:2:2.0:4.0 | 700° C. | 1 hr. | x | | |
| 36) | 0.8:2:2.0:4.0 | 700° C. | 1 hr. | o | Tc = 134K | $-7.6 \times 10^{-4}$ emu/g |
| 37) | 1.0:2:2.0:4.0 | 600° C. | 1 hr. | Δ | Tc = 130K | $-8.6 \times 10^{-4}$ emu/g |
| 38) | 1.0:2:2.0:4.0 | 620° C. | 1 hr. | Δ | Tc = 131K | $-4.8 \times 10^{-4}$ emu/g |
| 39) | 1.0:2:2.0:4.0 | 640° C. | 1 hr. | o | Tc = 134K | $-7.4 \times 10^{-4}$ emu/g |
| 40) | 1.0:2:2.0:4.0 | 660° C. | 1 hr. | o | Tc = 134K | $-9.1 \times 10^{-4}$ emu/g |
| 41) | 1.0:2:2.0:4.0 | 680° C. | 1 hr. | o | Tc = 134K | $-7.6 \times 10^{-4}$ emu/g |
| 42) | 1.0:2:2.0:4.0 | 700° C. | 20 min. | o | Tc = 134K | $-83 \times 10^{-4}$ emu/g |
| 43) | 1.0:2:2.0:4.0 | 700° C. | 1 hr. | o | Tc = 134K | $-1.6 \times 10^{-3}$ emu/g |

[TABLE 2]-continued

| Sample No. | Composition | Temperature | Time | Diamagnetism (After Annealing) | |
|---|---|---|---|---|---|
| 44) | 1.0:2.0:2.0:4.0 | 700° C. | 3 hrs. | o Tc = 134K | $1.2 \times 10^{-3}$ emu/g |
| 45) | 1.0:2.0:2.0:4.0 | 720° C. | 1 hr. | o Tc = 134K | $-1.6 \times 10^{-3}$ emu/g |
| 46) | 1.0:2.0:2.0:4.0 | 740° C. | 1 hr. | o Tc = 134K | $-1.2 \times 10^{-4}$ emu/g |
| 47) | 1.0:2.0:2.0:4.0 | 760° C. | 1 hr. | o Tc = 134K | $-8.8 \times 10^{-4}$ emu/g |
| 48) | 1.0:2.0:2.0:4.0 | 780° C. | 1 hr. | o Tc = 134K | $-7.6 \times 10^{-4}$ emu/g |
| 49) | 1.0:2.0:2.0:4.0 | 800° C. | 1 hr. | Δ Tc = 131K | $-1.9 \times 10^{-4}$ emu/g |
| 50) | 1.0:2.0:2.0:4.0 | 820° C. | 1 hr. | x | |
| 51) | 1.2:2.0:2.0:4.0 | 700° C. | 1 hr. | o Tc = 134K | $-8.1 \times 10^{-4}$ emu/g |
| 52) | 1.4:2.0:2.0:4.0 | 700° C. | 1 hr. | Δ Tc = 130K | $-7.2 \times 10^{-4}$ emu/g |
| 53) | 1.6:2.0:2.0:4.0 | 700° C. | 1 hr. | x | |

Composition - Mole ratios of Hg:Ba:Ca:Cu (starting composition)
Diamagnetism -
o: superconducted at Tc ≧ 134K, magnetic susceptibility values were measured at 5K
Δ: superconducted at Tc < 134K, magnetic susceptibility values were measured at 5K
x: non-superconductive at temperatures exceeding 5K FIG. 1 shows magnetic susceptibility-temperature dependence of the annealed sample No. 11 appearing in Table 1. The magnetic susceptibility was measured with an SQUID under two conditions of cooling the sample in a zero magnetic field and thereafter applying a magnetic field thereto for increasing its temperature in an external magnetic field of 10 Oe (zero magnetic field cooling), and reducing the temperature of the sample in an external magnetic field of 10 Oe (magnetic field cooling). Referring to FIG. 1, the axis of abscissas shows the temperature (K), and the axis of ordinates shows the magnetic susceptibility M/H ($10^{-3}$ emu/g).

Figure 2:
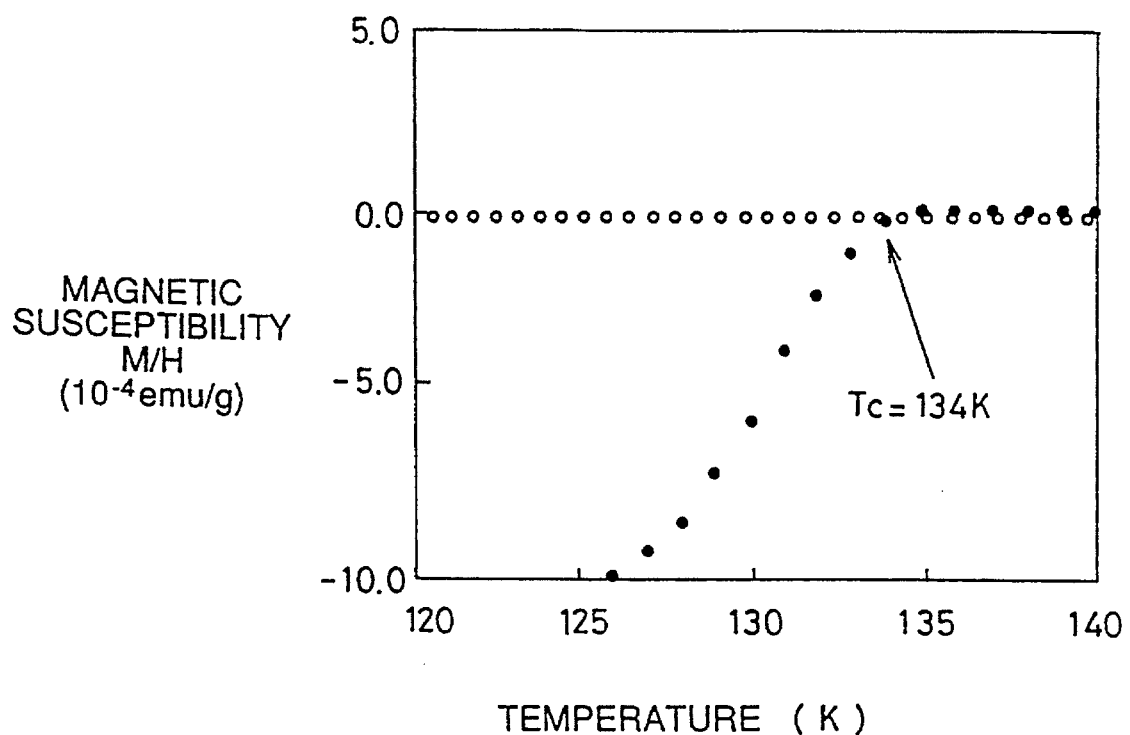
FIG. 2 illustrates magnetic susceptibility-temperature dependence of the annealed sample No. 11.

FIG. 2 is a partially enlarged view of FIG. 1. Referring to FIG. 2, the axis of abscissas shows the temperature (K), and the axis of ordinates shows the magnetic susceptibility M/H ($10^{-4}$ emu/g).

Referring to FIGS. 1 and 2, it is understood that the magnetic susceptibility shows steep superconductivity transition, with a superconductivity transition temperature Tc of 134 K. Further, a superconductivity volume fraction at 5 K. can be estimated as about 17% from the result of the magnetic field cooling measurement.

Figure 3:
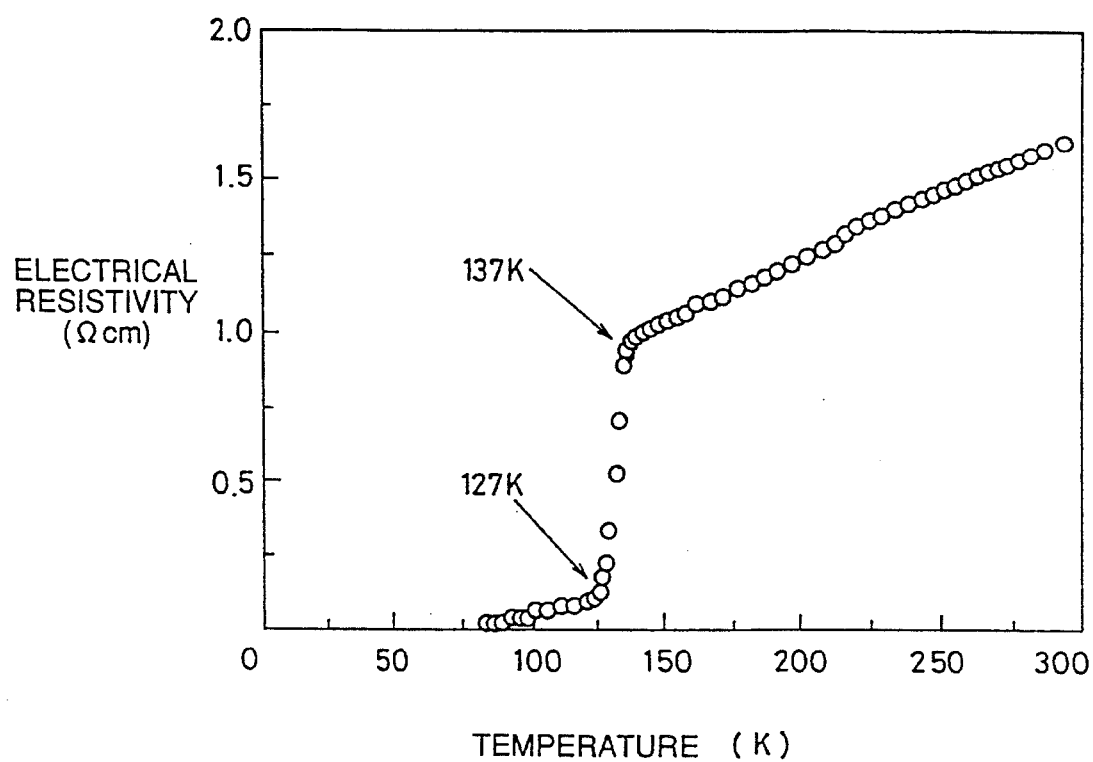
FIG. 3 illustrates electrical resistivity-temperature dependence of the annealed sample No. 11.

FIG. 3 illustrates electrical resistivity-temperature dependence of the annealed sample No. 11 appearing in Table 1. The electrical resistivity was measured by a four-probe method under a condition of cooling the sample from the room temperature (about 300 K.). Referring to FIG. 3, the axis of abscissas shows the temperature (K), and the axis of ordinates shows the electrical resistivity (Ωcm).

Referring to FIG. 3, the resistivity was abruptly reduced from 137 K., to exhibit zero resistance at 87 K. This result shows such a possibility that the resistivity reaches zero at about 127 K.

Then, compositions of crystal grains contained in the annealed sample No. 11 were analyzed with an X-ray microanalyzer. Electron beams of about 1 μm in diameter were arbitrarily applied to polished surfaces of the sample, to analyze the compositions. Table 3 shows the results.

[TABLE 3]

| ANALYSIS NO. | Composition (at. %) | | | |
|---|---|---|---|---|
| | Hg | Ba | Ca | Cu |
| 1 | 7.3 | 26.0 | 24.0 | 42.7 |
| 2 | 1.3 | 21.8 | 24.0 | 42.9 |

[TABLE 3]-continued

| ANALYSIS NO. | Composition (at. %) | | | |
|---|---|---|---|---|
| | Hg | Ba | Ca | Cu |
| 3 | 6.5 | 22.2 | 24.1 | 47.2 |
| 4 | 8.3 | 32.1 | 14.3 | 45.3 |
| 5 | 5.2 | 25.3 | 21.7 | 47.8 |
| 6 | 1.2 | 49.2 | 2.1 | 47.5 |
| 7 | 5.4 | 27.2 | 22.9 | 44.5 |
| 8 | 6.2 | 35.1 | 20.0 | 38.7 |
| 9 | 0.6 | 0.1 | 1.1 | 98.2 |
| 10 | 2.2 | 0.8 | 93.9 | 3.1 |
| 11 | 7.2 | 24.0 | 25.0 | 43.8 |
| 12 | 5.9 | 22.9 | 25.5 | 45.7 |
| 13 | 8.1 | 25.0 | 28.1 | 38.8 |
| 14 | 6.3 | 24.9 | 25.2 | 43.6 |
| 15 | 6.0 | 21.0 | 32.3 | 40.7 |
| 16 | 7.7 | 32.8 | 14.3 | 45.2 |
| 17 | 6.9 | 23.9 | 24.8 | 44.4 |
| 18 | 0.9 | 52.2 | 2.0 | 44.9 |
| 19 | 4.9 | 24.9 | 27.0 | 43.2 |
| 20 | 8.2 | 25.5 | 25.0 | 41.3 |
| 21 | 3.8 | 24.8 | 26.0 | 43.2 |
| 22 | 8.4 | 25.6 | 25.0 | 41.0 |
| 23 | 0.8 | 48.0 | 0.2 | 51.0 |
| 24 | 6.2 | 24.0 | 25.4 | 44.4 |
| 25 | 11.9 | 25.2 | 25.1 | 37.8 |

Referring to Table 3, measurement points Nos. 1, 2, 3, 5, 7, 11, 12, 13, 14, 17, 19, 20, 21, 22, 24 and 25 were relatively at identical degrees of ratios. On the average, Hg:Ba:Ca:Cu= 7.1:24.6:24.9:43.4. Although the ratios must be 12.5:25.0:25.0:37.5 in a substance which is expressed in a chemical formula HgBa$_2$Ca$_2$Cu$_3$O$_Y$, it is obvious that the analyzed values exhibited smaller mercury contents and larger copper contents as compared with the theoretical ratios. This result strongly suggests that the sample as obtained was (Hg, Cu)Ba$_2$Ca$_2$Cu$_3$O$_Y$ in which mercury was partially replaced by copper.

Further, Hg ratios in crystal grains which may be regarded as (Hg, Cu)Ba$_2$Ca$_2$Cu$_3$O$_Y$ phases fluctuated in a range over 11.9 (No. 25) and 3.8 (No. 21). This result shows presence of a solid solution in a range of X of 0.05 to 0.7 in (Hg$_{1-X}$)Ba$_2$Ca$_2$Cu$_3$O$_Y$.

Figure 4:
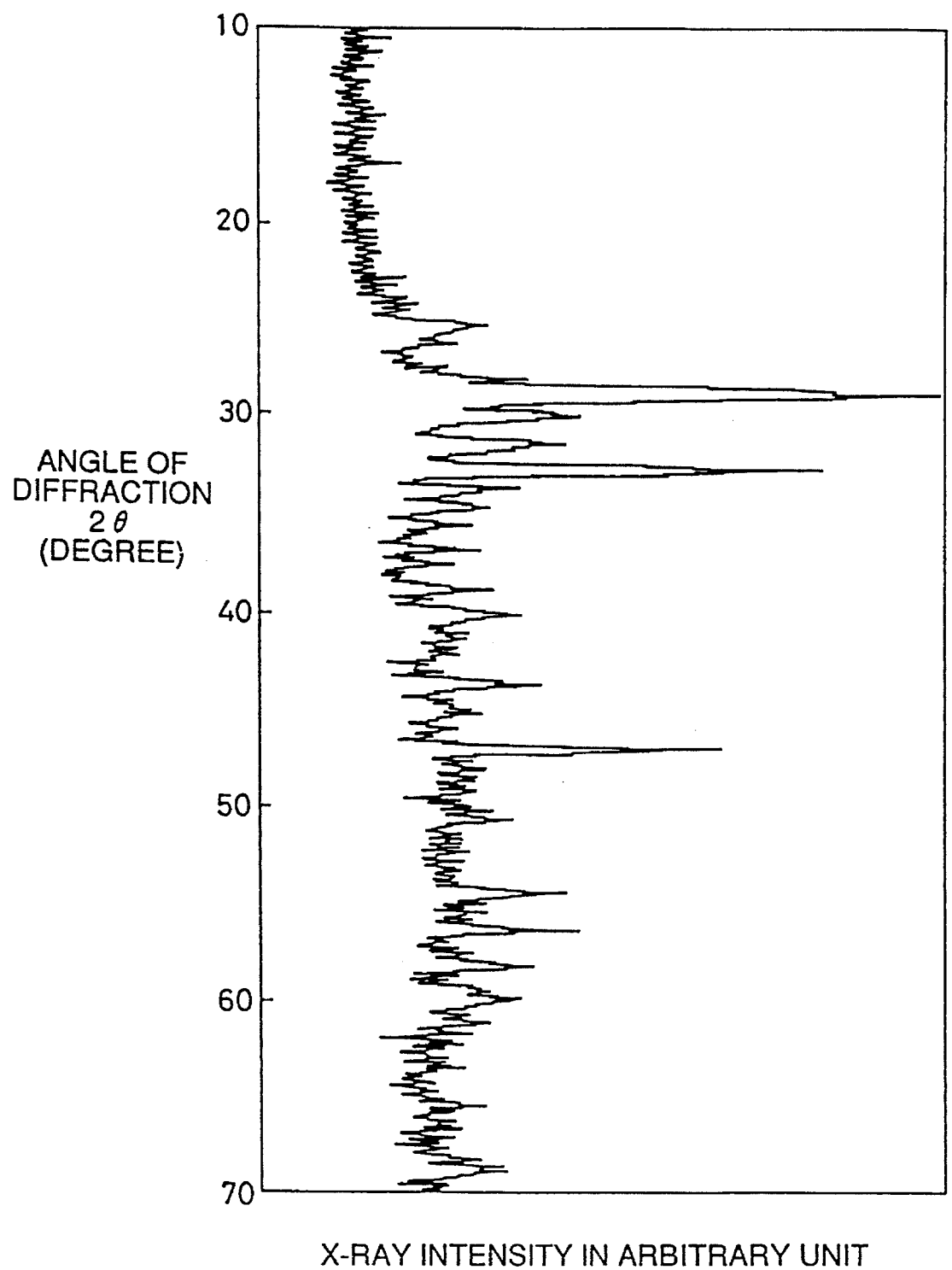
FIG. 4 illustrates a powder X-ray diffraction pattern of the annealed sample No. 11.

FIG. 4 illustrates a powder X-ray diffraction pattern of the annealed sample No. 11. Referring to FIG. 4, the axis of abscissas shows X-ray intensity in an arbitrary unit, and the axis of ordinates shows the angle of diffraction 2θ (degree).

Figure 5:
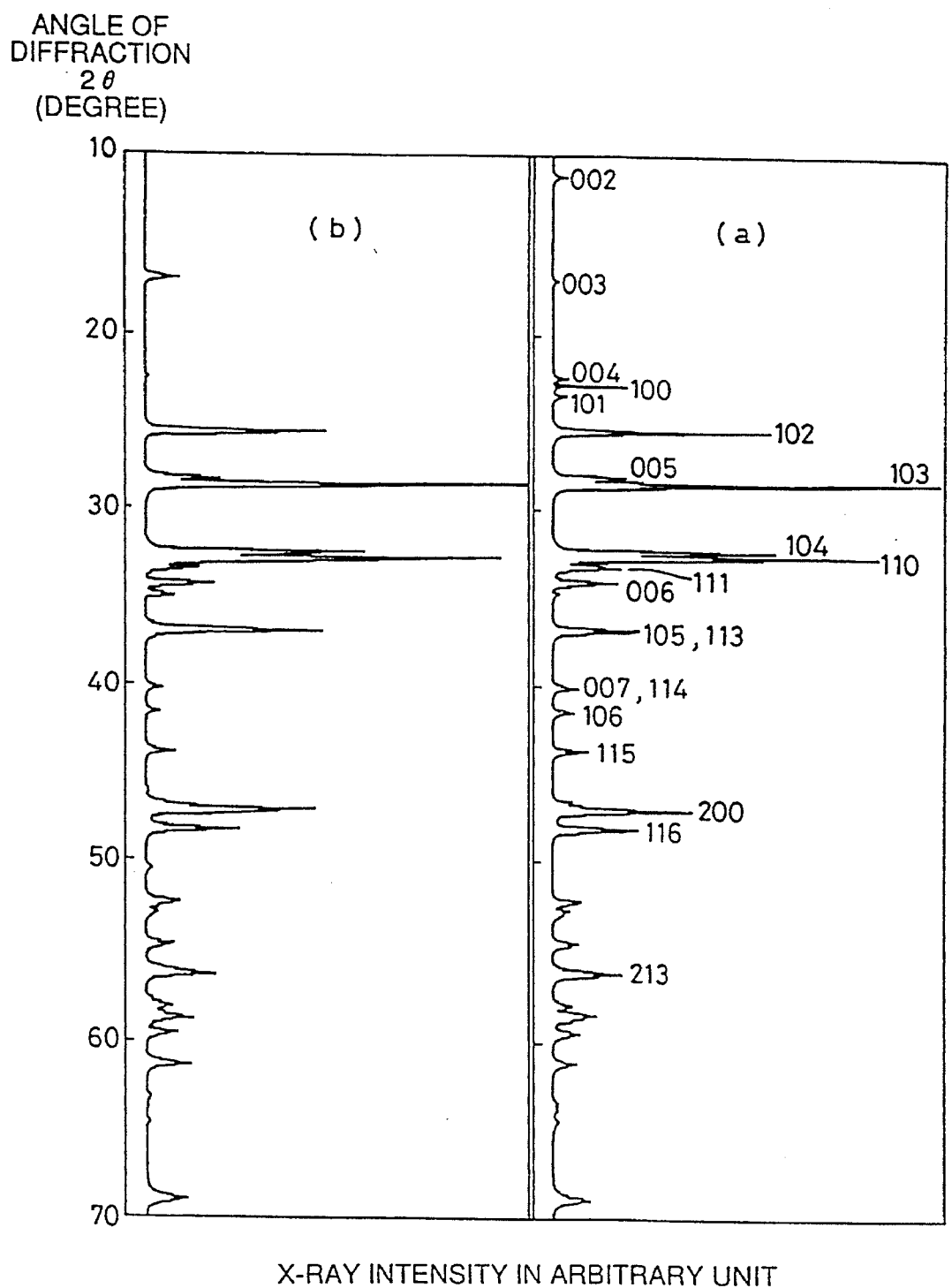
FIG. 5 illustrates simulated powder X-ray diffraction patterns.

FIG. 5 shows simulated powder X-ray diffraction patterns. Referring to FIG. 5, the axis of abscissas shows X-ray intensity in an arbitrary unit, and the axis of ordinates shows the angle of diffraction 2θ (degree). In FIG. 5, (a) shows a simulated powder X-ray diffraction pattern of $HgBa_2Ca_2Cu_3O_Y$ in which eight atomic layers of $HgO_Z$—BaO—$CuO_2$—Ca—$CuO_2$—Ca—$CuO_2$—BaO are stacked, as claimed by Schilling et al.. In FIG. 5, (b) further shows a simulated pattern of $(Hg_{0.5}Cu_{0.5})Ba_2Ca_2Cu_3O_Y$ in which mercury is half replaced by copper.

Referring to FIGS. 4 and 5, it is understood from the actual diffraction peaks that the main phase is a crystal phase having a tetragonal unit cell with a =3.85 Å and c =15.7 Å. While the two simulated patterns are considerably similar to each other, remarkable difference resides in that peak intensity values of 002 reflection and 003 reflection are inverted and peak intensity ratios (I(102)/I(105)) of 102 reflection to 105 reflection are 2 and 1 at (a) and (b) in FIG. 5 respectively. In the actual pattern shown in FIG. 4, the peak intensity in 003 reflection is higher than that in 002 reflection. Further, peak intensity values in 102 reflection and 105 reflection are at the same degrees. This result strongly suggests that the sample as obtained was (Hg, Cu)$Ba_2Ca_2Cu_3O_Y$ in which mercury was partially replaced by copper, and supports the result measured with the X-ray microanalyzer.

It is generally known that superconductivity is attained when holes of 0.05 to 0.50 are injected into a $CuO_2$ plane (J. B. Torrance et al., Physica C 162–164 (1989) 91). (Hg, Cu)$Ba_2Ca_2Cu_3O_Y$ according to the present invention exhibits excellent superconductivity. Thus, it is possible to infer the oxygen content Y (oxygen content Z in the atomic layer containing mercury). Assuming that each of mercury and copper forming an (Hg, Cu)$O_z$ layer is 2+, it can be referred to that superconductivity is attained when the oxygen content Z in this layer is 0.075 to 0.75. Even if the oxygen content Z is zero, it is possible to inject holes into a $CuO_2$ plane if mercury or copper has a mixed valence of 2+ and 1+. Thus, the oxygen content Z is conceivably 0 to 0.75 (Y=8 to 8.75).

Figure 6:
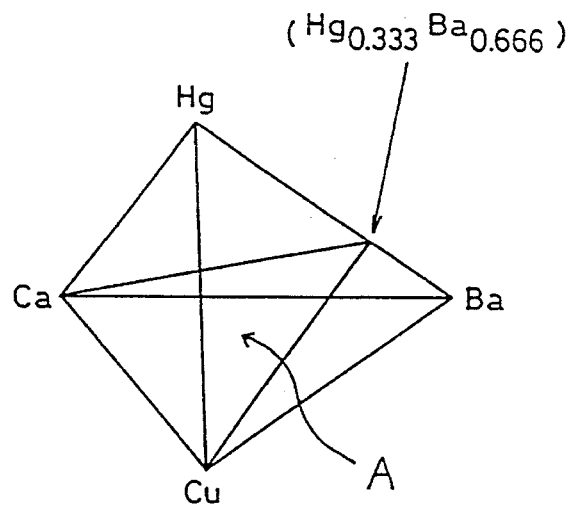
FIG. 6 is a quaternary system composition diagram of Hg, Ba, Ca and Cu.

FIG. 6 is a quaternary composition diagram of Hg, Ba, Ca and Cu.

Figure 7:
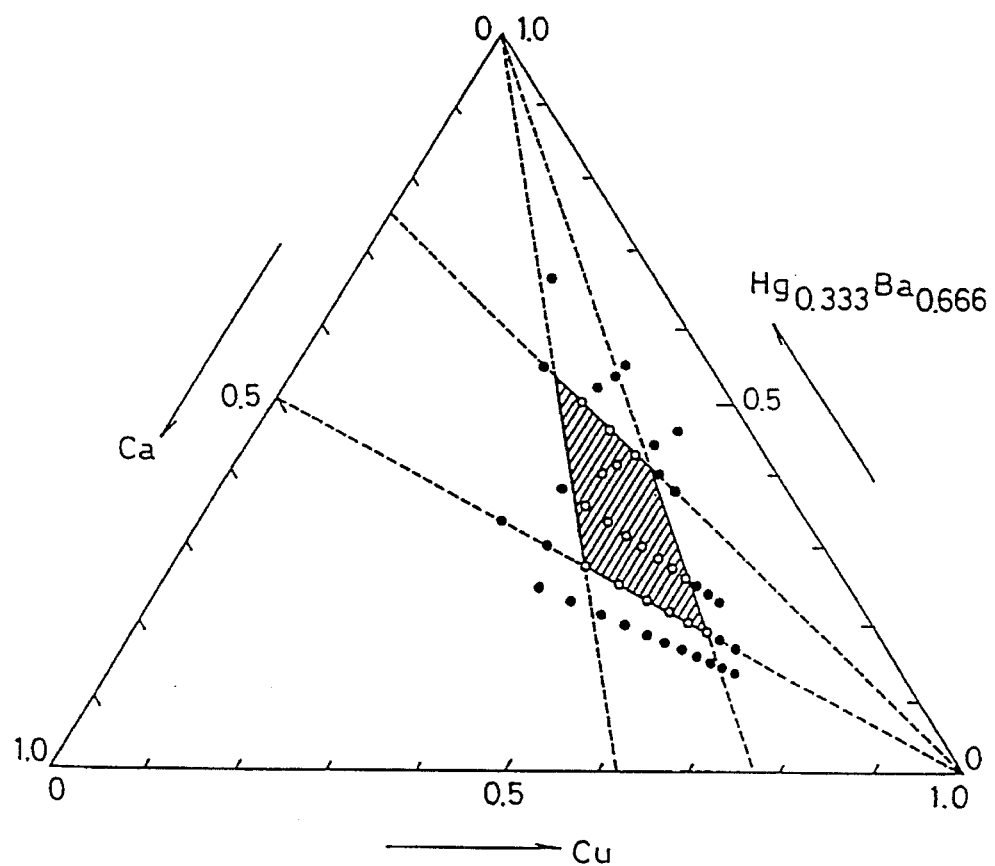
FIG. 7 shows a composition area capable of obtaining a superconducting material which exhibits a superconductivity transition temperature Tc of 134 K.

FIG. 7 shows a plane A appearing in FIG. 6, with a composition area capable of obtaining a superconducting material exhibiting a superconductivity transition temperature Tc of 134 K. with a ratio of Hg to Ba of 1:2 in a starting composition, a firing temperature of 700° C. and a firing time of 6 hours. Referring to FIG. 7, white circles show compositions exhibiting superconductivity transition temperatures Tc (Meissner) of 134 K., and black circles show compositions exhibiting superconductivity transition temperatures of less than 134 K. and those showing no superconduction.

Referring to FIG. 7, compositions encircling the white circles are expressed as (Hg+Ba):Ca:Cu=b:1:c and Hg:Ba= (1−a):a, wherein 1≦b≦3 and 1.667≦c≦3.444.

Although A. schilling et al. inferred that a substance exhibiting a high superconductivity transition temperature Tc of up to 130 K. may be $HgBa_2Ca_2Cu_3O_Y$, no superconductivity was attained when the materials were mixed with each other in the starting composition as such.

Noting compositions with various starting amounts of mercury shown in Tables 1 and 2, superconducting materials exhibiting superconductivity transition temperatures Tc of 134 K. were attained when Hg:Ba=(0.8 to 1.2):2, i.e., when Hg:Ba=(1−a):a, wherein 0.625≦a≦0.714.

Referring to Tables 1 and 2, firing temperatures were studied with respect to the samples Nos. 37 to 50, to find that a temperature range was of 640° to 780° C. On the other hand, firing temperatures were varied with respect to the samples Nos. 3 to 5 and 42 to 44, which exhibited superconductivity transition temperatures Tc of 134 K.

While a number of further samples were prepared in addition to those described above, the samples as obtained exhibited superconductivity transition temperatures Tc of 134 K. in excellent reproducibility when the same were prepared by mixing raw materials within the range of the aforementioned starting compositions, regardless of the types of the raw materials and the closed containers.

When the raw materials were fired in flowing oxygen gas, in flowing argon gas or in air with no employment of a closed container, no (Hg, Cu)$Ba_2Ca_2Cu_3O_Y$ was obtained due to evaporation of mercury at a temperature exceeding 500° C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxide superconductor consisting essentially of Hg, Ba, Ca, Cu and O, being expressed in a chemical formula $(Hg_{1-X}Cu_X)Ba_2Ca_2Cu_3O_Y$, wherein X=0.05 to 0.7 and Y=8 to 8.75.

2. An oxide superconductor in accordance with claim 1, having such a crystal structure that eight atomic layers of (Hg, Cu)$O_z$—BaO—$CuO_2$—Ca—$CuO_2$—Ca—$CuO_2$—BaO, wherein Z=0 to 0.75, are stacked.

* * * * *